US010797256B2

(12) United States Patent
Yoneda et al.

(10) Patent No.: US 10,797,256 B2
(45) Date of Patent: Oct. 6, 2020

(54) ORGANIC ELECTROLUMINESCENCE DEVICE, ORGANIC ELECTROLUMINESCENCE UNIT, AND ELECTRONIC APPARATUS

(71) Applicant: JOLED INC., Tokyo (JP)

(72) Inventors: Kazuhiro Yoneda, Tokyo (JP); Noriyuki Matsusue, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/607,861

(22) Filed: May 30, 2017

(65) Prior Publication Data
US 2018/0026220 A1     Jan. 25, 2018

(30) Foreign Application Priority Data

Jul. 20, 2016  (JP) ................................ 2016-142273
Dec. 21, 2016  (JP) ................................ 2016-248123

(51) Int. Cl.
*H01L 51/50*    (2006.01)

(52) U.S. Cl.
CPC ...... *H01L 51/5004* (2013.01); *H01L 51/5012* (2013.01); *H01L 51/5056* (2013.01); *H01L 51/5072* (2013.01); *H01L 2251/552* (2013.01)

(58) Field of Classification Search
CPC ................................ H01L 35/24; H01L 51/50
See application file for complete search history.

(56) References Cited

U.S. PATENT DOCUMENTS

| | | | |
|---|---|---|---|
| 2002/0127427 A1* | 9/2002 | Young ................... | C09K 11/06 428/690 |
| 2003/0136959 A1* | 7/2003 | Araki .................. | H01L 51/5265 257/40 |
| 2004/0097101 A1* | 5/2004 | Kwong ............... | H01L 51/0003 438/781 |
| 2008/0231177 A1 | 9/2008 | Nomura et al. | |
| 2010/0176389 A1* | 7/2010 | Chun .................. | H01L 51/5036 257/40 |
| 2010/0301383 A1 | 12/2010 | Shitagaki et al. | |
| 2014/0091293 A1 | 4/2014 | Suzuki et al. | |

FOREIGN PATENT DOCUMENTS

| | | |
|---|---|---|
| JP | 2003-007467 A | 1/2003 |
| JP | 2008-270770 A | 11/2008 |
| JP | 2011-009205 A | 1/2011 |
| JP | 2014-090165 A | 5/2014 |
| JP | 2014-175479 A | 9/2014 |
| JP | 2014-225710 A | 12/2014 |
| WO | 2013/015198 A1 | 1/2013 |

* cited by examiner

Primary Examiner — Lex H Malsawma
Assistant Examiner — Geoffrey H Ida
(74) Attorney, Agent, or Firm — Xsensus LLP

(57) ABSTRACT

An organic electroluminescence device includes, in order, a first electrode, a hole transport layer, an organic light-emitting layer, an electron transport layer, and a second electrode. The hole transport layer is configured by a coated film. The organic light-emitting layer is configured by a coated film. The organic light-emitting layer has a light emission region provided in the organic light-emitting layer on side of the electron transport layer.

17 Claims, 8 Drawing Sheets

ORGANIC ELECTROLUMINESCENCE DEVICE, ORGANIC ELECTROLUMINESCENCE UNIT, AND ELECTRONIC APPARATUS

CROSS REFERENCE TO RELATED APPLICATIONS

This application claims the benefit of Japanese Priority Patent Application JP 2016-142273 filed on Jul. 20, 2016, and Japanese Priority Patent Application JP 2016-248123 filed on Dec. 21, 2016, the entire contents of both of which are incorporated herein by reference.

BACKGROUND

The disclosure relates to an organic electroluminescence device, an organic electroluminescence unit, and an electronic apparatus.

Various organic electroluminescence units such as organic electroluminescence displays each including an organic electroluminescence device have been proposed, as disclosed in Japanese Unexamined Patent Application Publications No. 2008-270770, No. 2011-009205, and No. 2014-225710, for example.

SUMMARY

An organic electroluminescence unit is generally requested to have an enhanced device performance of an organic electroluminescence device.

It is desirable to provide an organic electroluminescence device having an enhanced device performance, and an organic electroluminescence unit and an electronic apparatus that make it possible to enhance the device performance of the organic electroluminescence device.

An organic electroluminescence device according to an embodiment of the disclosure includes, in order, a first electrode, a hole transport layer, an organic light-emitting layer, an electron transport layer, and a second electrode. The hole transport layer is configured by a coated film. The organic light-emitting layer is configured by a coated film. The organic light-emitting layer has a light emission region provided in the organic light-emitting layer on side of the electron transport layer.

An organic electroluminescence unit according to an embodiment of the disclosure is provided with a plurality of organic electroluminescence devices. In the organic electroluminescence unit, one or more of the plurality of organic electroluminescence devices include, in order, a first electrode, a hole transport layer, an organic light-emitting layer, an electron transport layer, and a second electrode. The hole transport layer is configured by a coated film. The organic light-emitting layer is configured by a coated film. The organic light-emitting layer has a light emission region provided in the organic light-emitting layer on side of the electron transport layer.

An electronic apparatus according to an embodiment of the disclosure is provided with an organic electroluminescence unit. The organic electroluminescence unit in the electronic apparatus has a plurality of organic electroluminescence devices. One or more of the plurality of organic electroluminescence devices include, in order, a first electrode, a hole transport layer, an organic light-emitting layer, an electron transport layer, and a second electrode. The hole transport layer is configured by a coated film. The organic light-emitting layer is configured by a coated film. The organic light-emitting layer has a light emission region provided in the organic light-emitting layer on side of the electron transport layer.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

Figure 1:
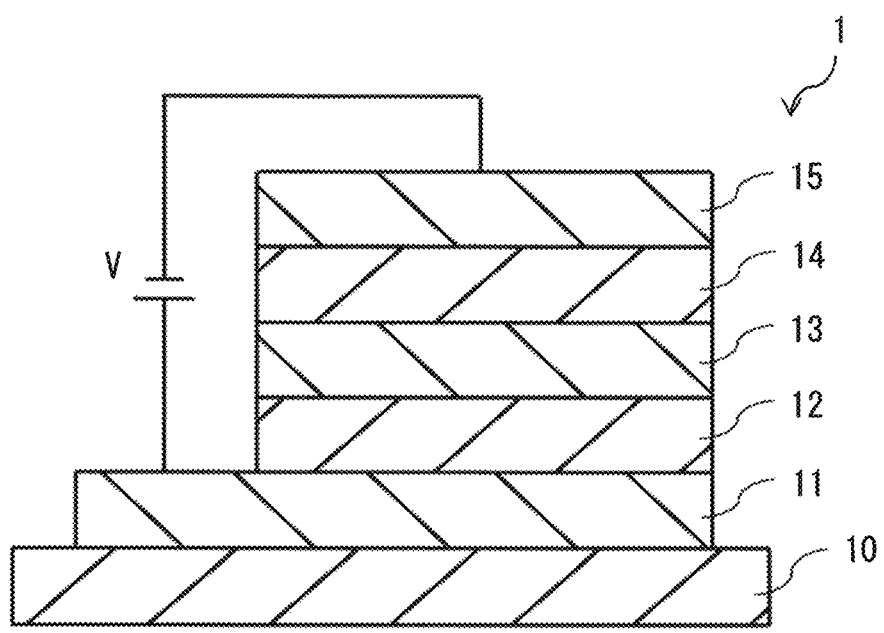
FIG. 1 illustrates an example of a cross-sectional configuration of an organic electroluminescence device according to a first embodiment of the disclosure.
Figure 2:
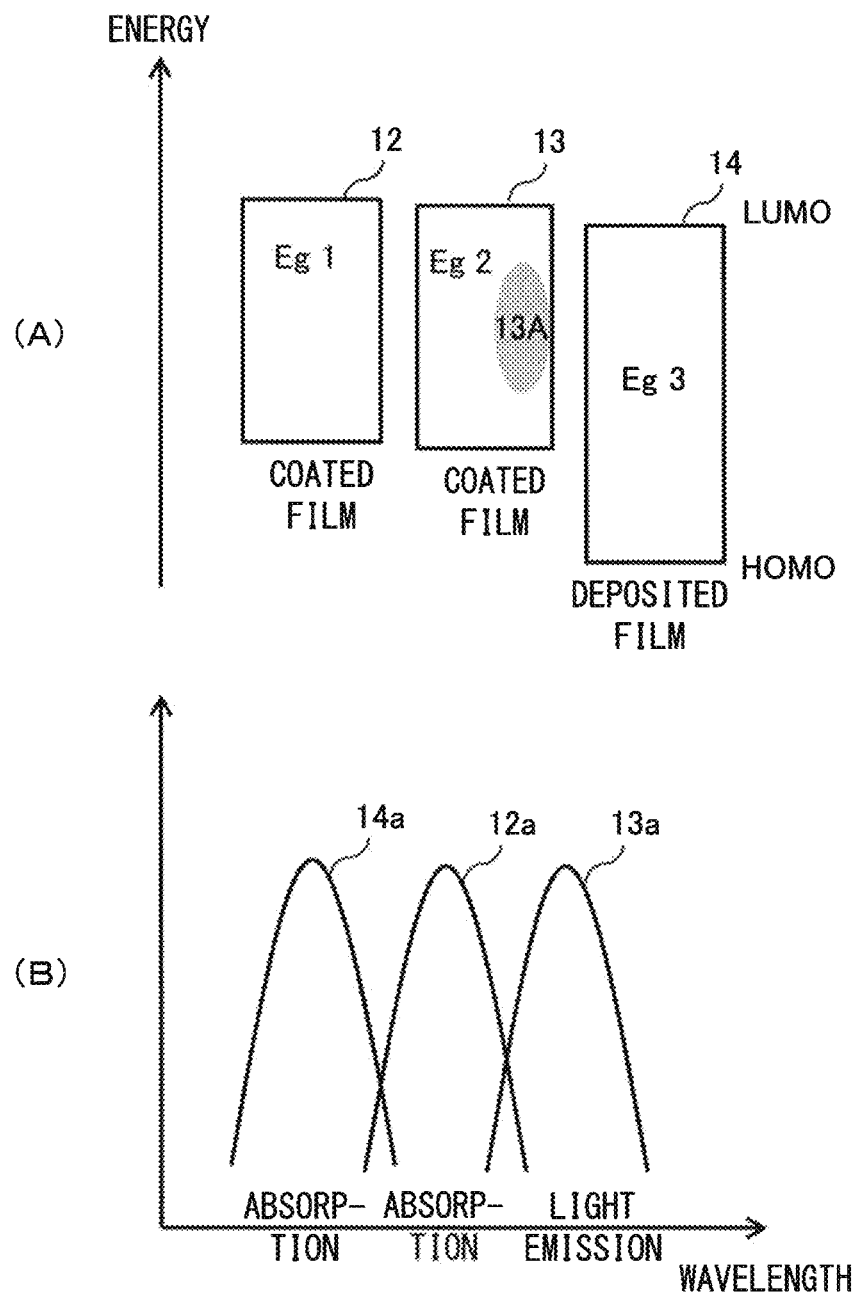

(A) of FIG. 2 schematically illustrates an example of energy band structures of respective layers of the organic electroluminescence device of FIG. 1; and (B) of FIG. 2 illustrates an example of absorption spectra of a hole transport layer and an electron transport layer in (A) of FIG. 2 as well as an example of an emission spectrum of an organic light-emitting layer in (A) of FIG. 2.

Figure 3:
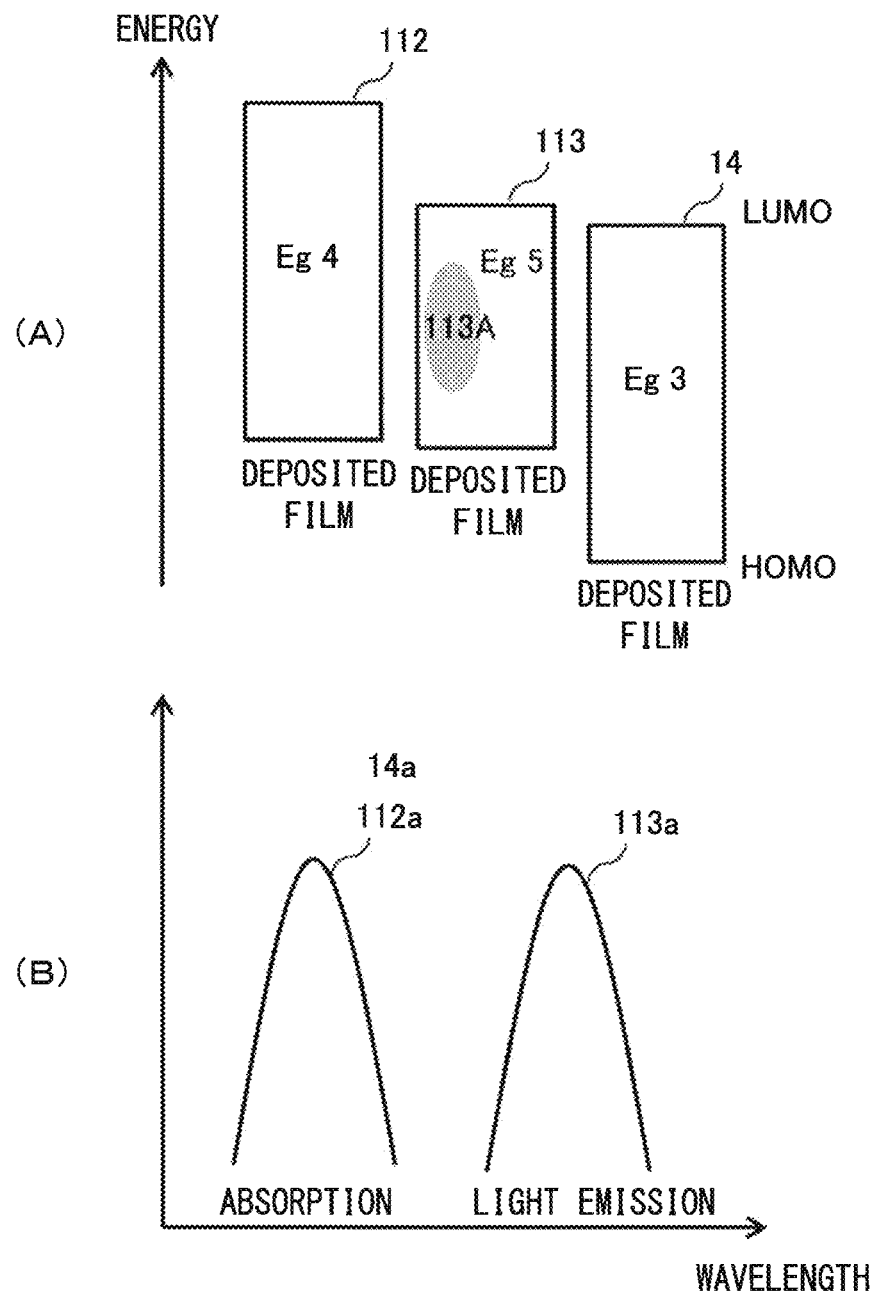

(A) of FIG. 3 schematically illustrates an example of energy band structures of respective layers of an organic electroluminescence device of Comparative Example A; and (B) of FIG. 3 illustrates an example of absorption spectra of a hole transport layer and an electron transport layer in (A) of FIG. 3 as well as an example of an emission spectrum of an organic light-emitting layer in (A) of FIG. 3.

Figure 4:
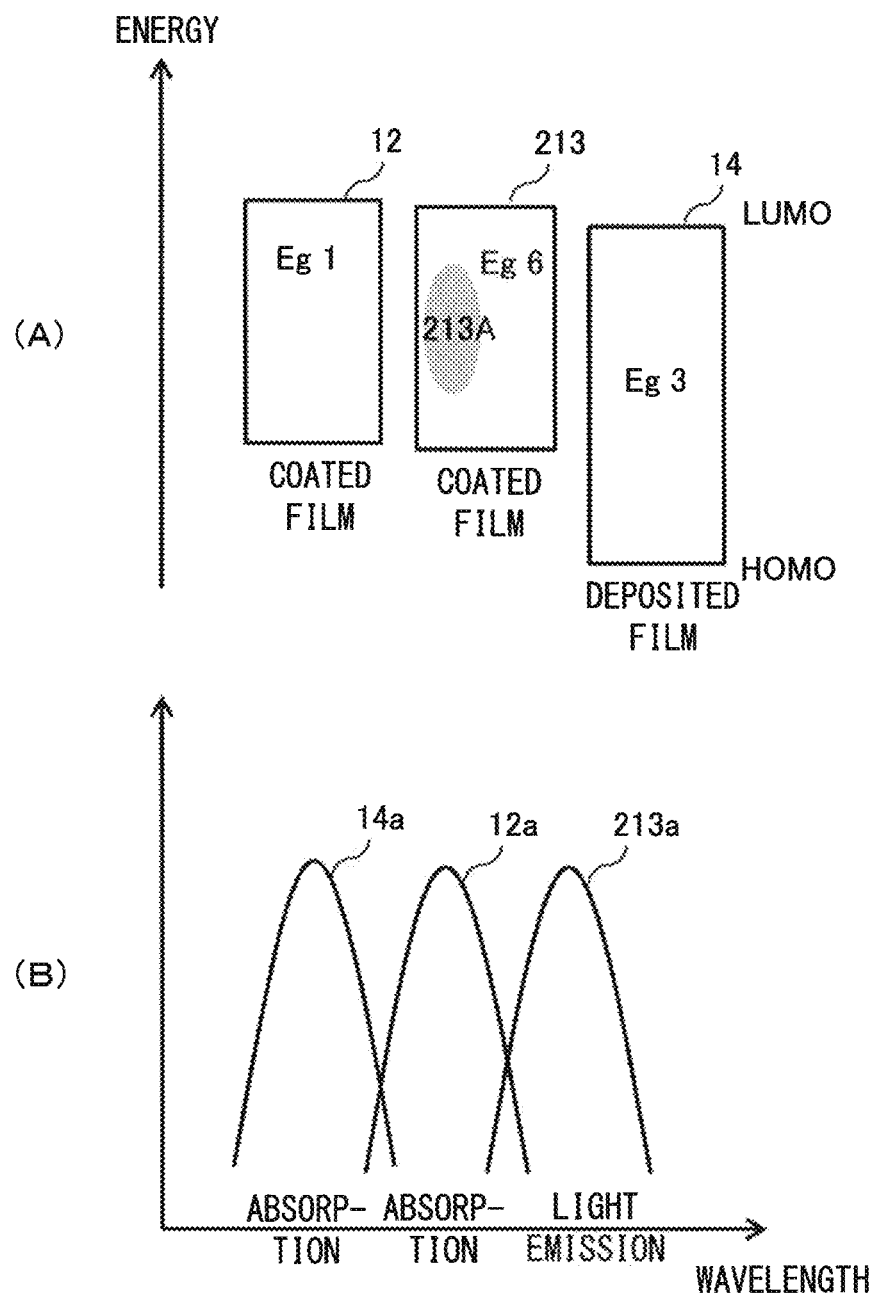

(A) of FIG. 4 schematically illustrates an example of energy band structures of respective layers of an organic electroluminescence device of Comparative Example B; and (B) of FIG. 4 illustrates an example of absorption spectra of a hole transport layer and an electron transport layer in (A) of FIG. 4 as well as an example of an emission spectrum of an organic light-emitting layer in (A) of FIG. 4.

Figure 5A:
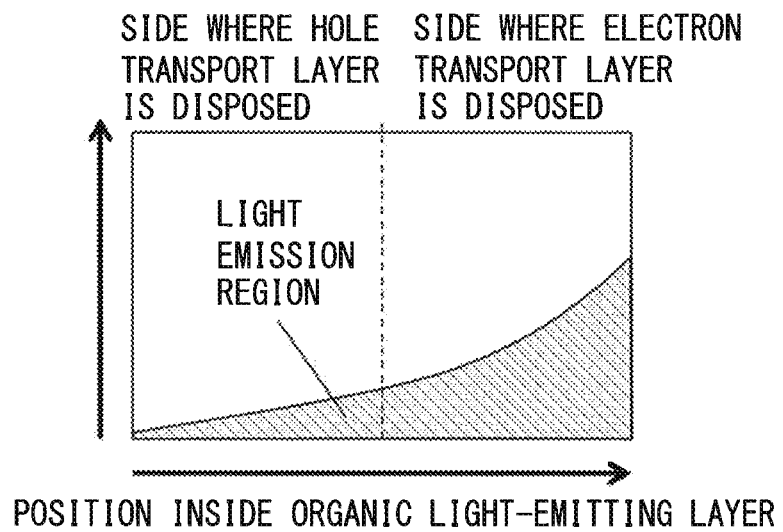

FIG. 5A illustrates an example of a light emission region inside an organic light-emitting layer.

Figure 5B:
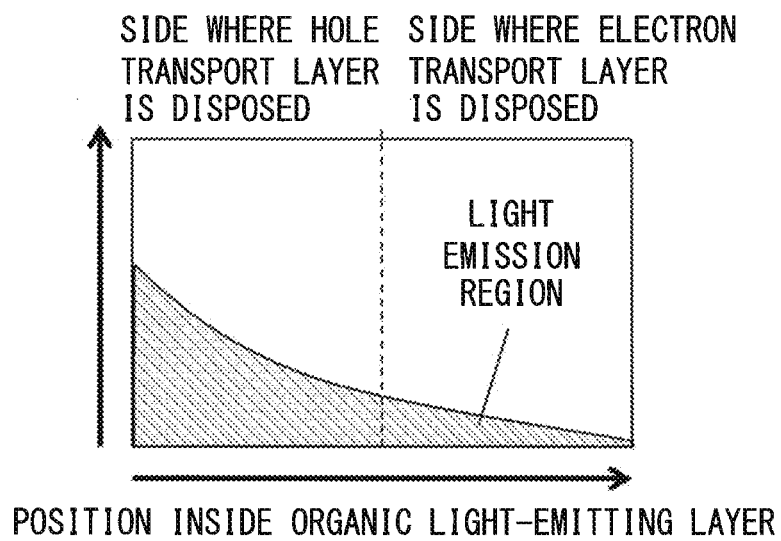

FIG. 5B illustrates an example of the light emission region inside the organic light-emitting layer.

Figure 5C:
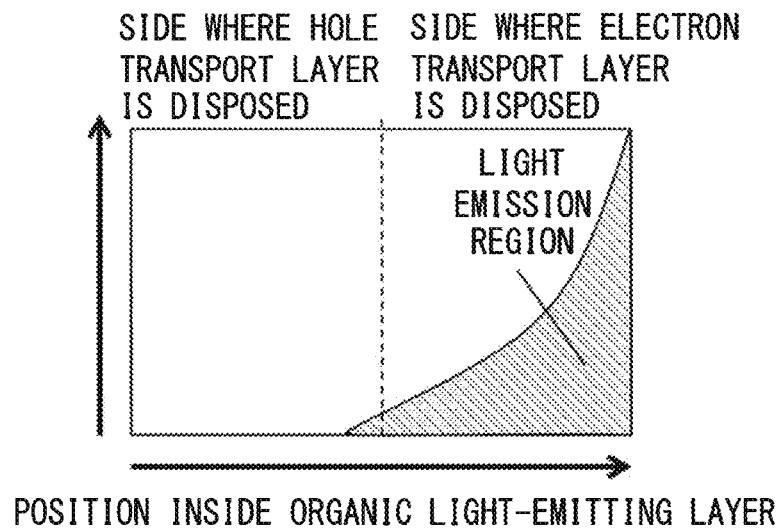

FIG. 5C illustrates an example of the light emission region inside the organic light-emitting layer.

Figure 5D:
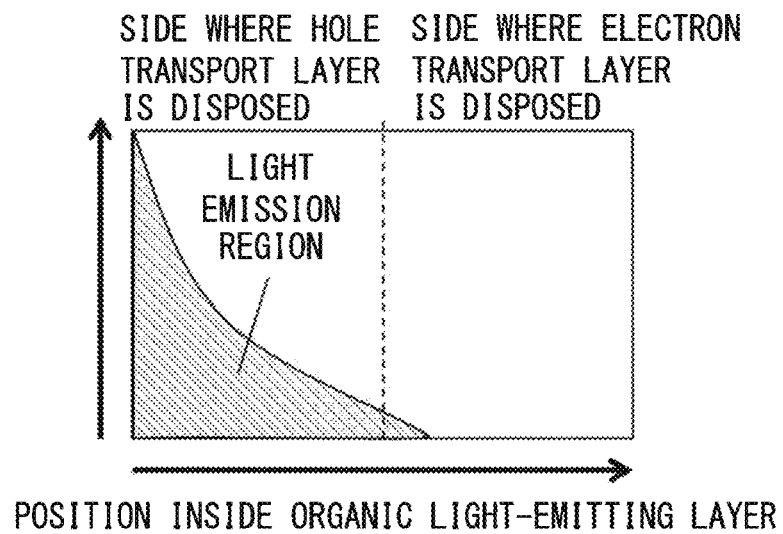

FIG. 5D illustrates an example of the light emission region inside the organic light-emitting layer.

Figure 6:
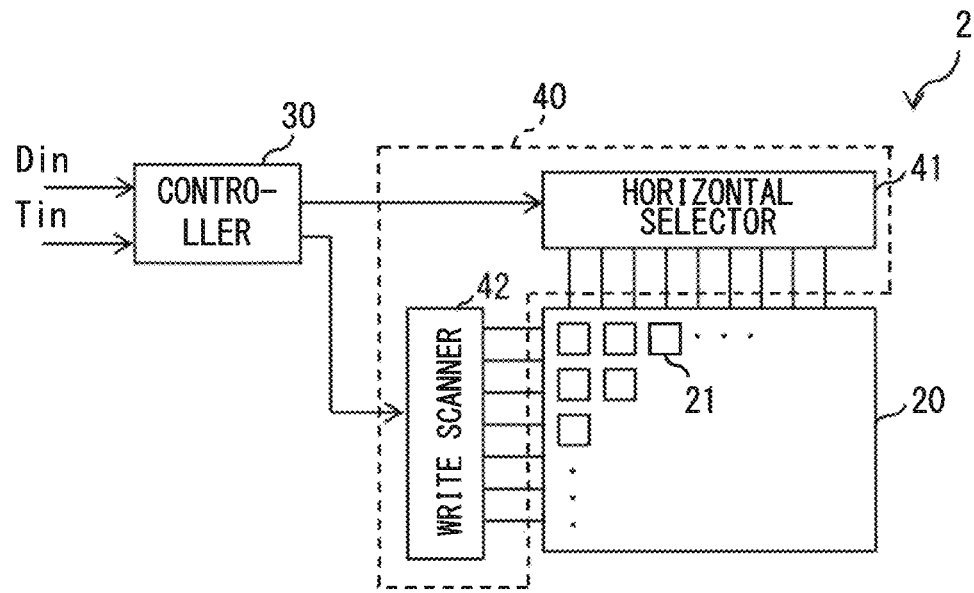

FIG. 6 illustrates an example of an outline configuration of an organic electroluminescence unit according to a second embodiment of the disclosure.

Figure 7:
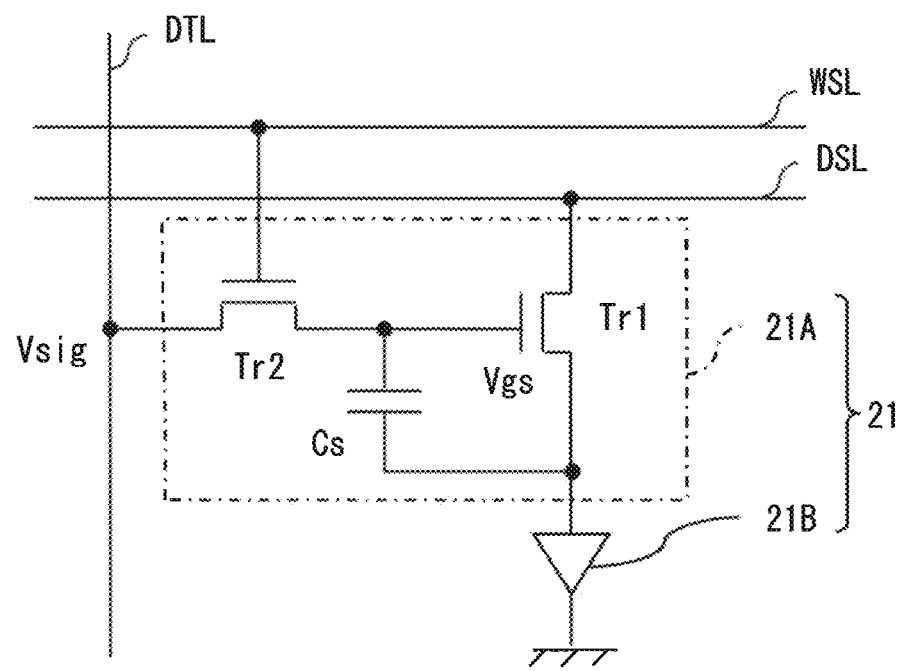

FIG. 7 illustrates an example of a circuit configuration of a pixel in FIG. 6.

Figure 8:
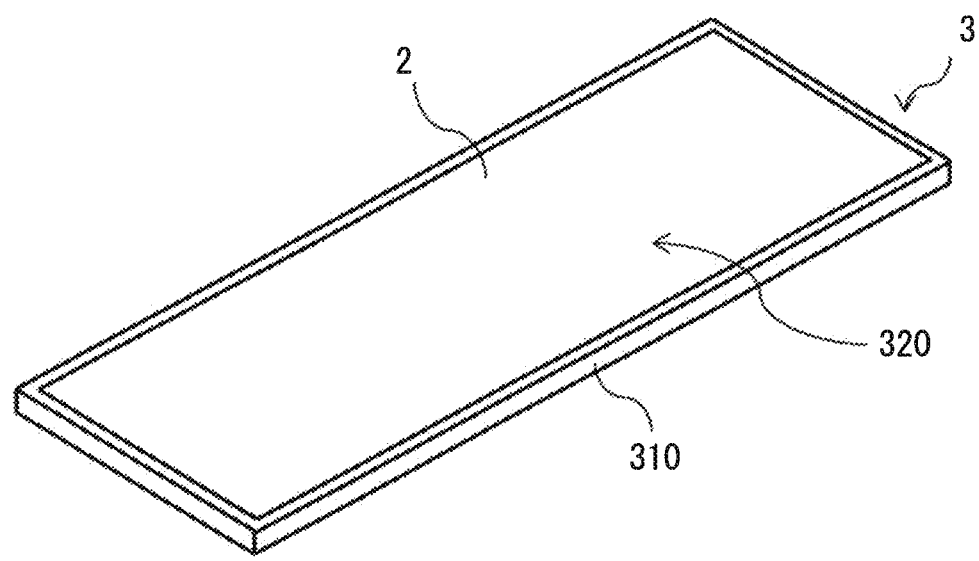

FIG. 8 is a perspective view of an example of an appearance of an electronic apparatus provided with the organic electroluminescence unit of an embodiment of the disclosure.

Figure 9:
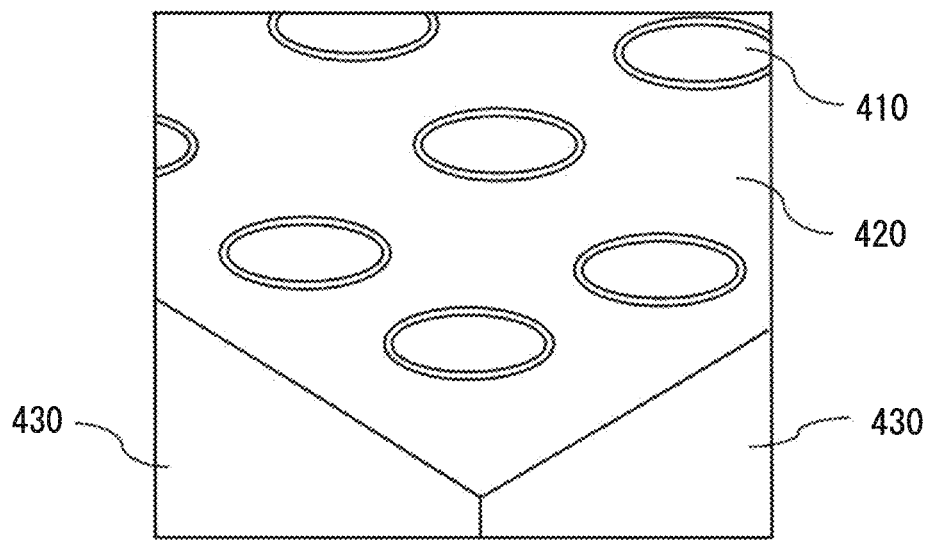

FIG. 9 is a perspective view of an example of an appearance of an illumination apparatus provided with the organic electroluminescence device of an embodiment of the disclosure.

DETAILED DESCRIPTION

Some example embodiments of the disclosure are described below in detail with reference to the accompanying drawings. The example embodiments described below each illustrate a specific but non-limiting preferred example of the disclosure. Accordingly, factors such as numerical value, shape, material, components, and arrangement positions and the connection of the components are merely examples, and are not to be construed as limiting to the disclosure. Therefore, among the elements in the following example embodiments, the elements that are not recited in a most-generic independent claim according to an embodiment of the disclosure are each described as an optional element. It is to be noted that the drawings are schematic diagrams, and are not necessarily accurate in a strict sense. Further, in the drawings, the same reference numerals are assigned to substantially the same components, and overlapping descriptions are omitted or simplified. It is to be noted that the description is given in the following order.

1. First Embodiment (Organic Electroluminescence Device)
2. Second Embodiment (Organic Electroluminescence Unit)
3. Application Example (Electronic Apparatus and Illumination Apparatus)

1. First Embodiment

[Configuration]

FIG. 1 illustrates an example of a cross-sectional configuration of an organic electroluminescence device 1 according to a first embodiment of the disclosure. The organic electroluminescence device 1 may be provided, for example, on a substrate 10. The organic electroluminescence device 1 includes, for example, an organic light-emitting layer 13, a hole transport layer 12, and an electron transport layer 14. The hole transport layer 12 and the electron transport layer 14 are so disposed as to interpose the organic light-emitting layer 13 therebetween. The hole transport layer 12 may be provided on hole-injection side of the organic light-emitting layer 13, and the electron transport layer 14 may be provided on electron-injection side of the organic light-emitting layer 13. The organic electroluminescence device 1 may have a device structure of including, for example, an anode 11, the hole transport layer 12, the organic light-emitting layer 13, the electron transport layer 14, and a cathode 15, in this order, from the substrate 10. The organic electroluminescence device 1 may further include other functional layers such as a hole injection layer and an electron injection layer.

The substrate 10 may be, for example, a light-transmissive translucent substrate such as a transparent substrate, and may be, for example, a glass substrate made of a glass material. It is to be noted that the substrate 10 is not only limited to the glass substrate, but may also be either a translucent resin substrate made of a translucent resin material such as polycarbonate resin and acrylic resin, or a thin-film transistor (TFT) substrate that is a backplane of an organic electroluminescence (EL) display unit.

The anode 11 may be provided on the substrate 10, for example. The anode 11 may be a transparent electrode having translucency. For example, a transparent electrically conductive film made of a transparent electrically conductive material such as indium tin oxide (ITO) and indium zinc oxide (IZO) may be used for the anode 11. It is to be noted that the anode 11 is not only limited to the transparent electrode, but may also be either an electrode made of any of aluminum (Al), silver (Ag), an aluminum alloy, and a silver alloy, for example, or a reflective electrode having reflectivity. The anode 11 may also have a layered configuration of the reflective electrode and the transparent electrode.

The hole transport layer 12 may serve to transport, to the organic light-emitting layer 13, holes injected from the anode 11. The hole transport layer 12 may be a coated film, and may be formed by coating and drying of a solution containing, as a solute, a hole transporting material 12M. In other words, the hole transport layer 12 may include the hole transporting material 12M. Further, the hole transporting material 12M that is a solute may have an insoluble function. The insoluble function refers to a function in which an insoluble group such as a cross-linking group and a thermal dissociation soluble group undergoes chemical transformation, which is caused by irradiation with heat or ultraviolet rays, for example, or by a combination thereof, thus allowing the chemically transformed group to be insoluble to an organic solvent or water. Accordingly, the hole transport layer 12 may be an insolubilized hole transport layer.

The hole transport layer 12 may be made of the hole transporting material 12M having the insoluble function. Examples of the hole transporting material 12M that is a raw material, i.e., a material of the hole transport layer 12 may include an arylamine derivative, a triazole derivative, an oxadiazole derivative, an imidazole derivative, a polyarylalkane derivative, a pyrazoline derivative and a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, and a tetraphenylbenzene derivative, and a combination thereof. The hole transporting material 12M may further contain, in a molecular structure thereof, a group such as a soluble group, a cross-linking group, and a thermal dissociation soluble group, for example, for functions of solubility and insolubilization.

The organic light-emitting layer 13 may serve to emit light of a predetermined color by recombination of holes and electrons. The organic light-emitting layer 13 may be a coated film, and may be formed, for example, by coating and drying of a solution containing the organic light-emitting material 13M as a solute. The solution having the organic light-emitting material 13M as a solute may include, for example, the organic light-emitting material 13M and a solvent. The organic light-emitting layer 13 may be a layer that emits light through generation of excitons caused by recombination, inside the organic light-emitting layer 13, of holes injected from the anode 11 and electrons injected from the cathode 15. The organic light-emitting layer 13 may be, for example, a blue light-emitting layer made of a blue organic light-emitting material. The organic light-emitting material 13M that is a raw material, i.e., a material of the organic light-emitting layer 13 may be, for example, a single dopant material, but more preferably may be a combination of a host material and the dopant material. In other words, the organic light-emitting layer 13 may include, as the organic light-emitting material, the host material and the dopant material. The host material serves a main function of transporting charge of electrons or holes, and the dopant material serves a light-emitting function. Each of the host material and the dopant material is not only limited to a single type material, but may also be a combination of two or more types of materials. The amount of the dopant material to the host material may be preferably in a range from 0.01% by weight to 30% by weight, and more preferably from 0.01% by weight to 10% by weight.

Examples of the host material of the organic light-emitting layer 13 may include an amine compound, a condensed polycyclic aromatic compound, and a heterocyclic compound. Examples of the amine compound may include a monoamine derivative, a diamine derivative, a triamine derivative, and a tetraamine derivative. Example of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Example of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Examples of the dopant material of the organic light-emitting layer 13 may include a pyrene derivative, a fluoranthene derivative, an arylacetylene derivative, a fluorene derivative, a perylene derivative, an oxadiazole derivative, an anthracene derivative, and a chrysene derivative. In addition, a metal complex may also be used for the dopant material of the organic light-emitting layer 13. Examples of the metal complex may include a metal complex containing a ligand and an atom of metal such as iridium (Ir), platinum (Pt), osmium (Os), gold (Au), rhenium (Re), and ruthenium (Ru).

The organic light-emitting layer 13 may be made of an organic light-emitting material having hole mobility that is larger than electron mobility. In other words, the organic light-emitting layer 13 may be a layer made of a material having a higher hole transporting property, and may be a layer having hole mobility that is larger than electron mobility. A constituent material of each of the hole transport layer 12 and the electron transport layer 14 may be a material in accordance with the constituent material of the organic light-emitting layer 13.

The electron transport layer 14 may serve to transport electrons injected from the cathode 15 to the organic light-emitting layer 13. The electron transport layer 14 may be a deposited film. The electron transport layer 14 may be made of, for example, an organic material having an electron transporting property (hereinafter, referred to as "electron transporting material 14M"). The electron transport layer 14 may be made of an organic material having a hole-blocking property as well as a wide energy gap suitable for preventing exciton deactivation. The electron transport layer 14 may be made of an organic material having an energy gap which is larger than an energy gap in the organic light-emitting layer 13.

The electron transport layer 14 may be interposed between the organic light-emitting layer 13 and the cathode 15, and may serve to transport electrons injected from the cathode 15 to the organic light-emitting layer 13. It is to be noted that the electron transport layer 14 may preferably further have functions such as a charge-blocking function of suppressing tunneling of charges (i.e., holes in the present embodiment) to the cathode 15 from the organic light-emitting layer 13, and a function of suppressing light extinction in an excitation state of the organic light-emitting layer 13. The electron transporting material 14M that is a raw material, i.e., a material of the electron transport layer 14 may be, for example, an aromatic heterocyclic compound containing one or more hetero atoms in a molecule. Examples of the aromatic heterocyclic compound may include a compound containing, as a skeleton, a pyridine ring, a pyrimidine ring, a triazine ring, a benzimidazole ring, a phenanthroline ring, and a quinazoline ring. The electron transport layer 14 may also contain metal having the electron transporting property. The electron transport layer 14 that contains the metal having the electron transporting property may enhance the electron transporting property of the electron transport layer 14. Examples of the metal contained in the electron transport layer 14 may include barium (Ba), lithium (Li), calcium (Ca), potassium (K), cesium (Cs), sodium (Na), and rubidium (Rb).

The cathode 15 may be a reflective electrode having light reflectivity, and may be, for example, a metal electrode made of a metal material having reflectivity. Examples of the material of the cathode 15 may include aluminum (Al), magnesium (Mg), silver (Ag), an aluminum-lithium alloy, and a magnesium-silver alloy. It is to be noted that the cathode 15 is not only limited to the reflective electrode, but may also be a transparent electrode made of an ITO film, for example, as with the anode 11. In the present embodiment, the substrate 10 and the anode 11 may each have translucency, and the cathode 15 has reflectivity. Thus, the organic electroluminescence device 1 has a bottom emission structure in which light is emitted from the substrate 10. It is to be noted that the organic electroluminescence device 1 is not only limited to having the bottom emission structure, but may also have a top emission structure.

Description is next given of an example feature of the organic electroluminescence device 1 according to the present embodiment also with reference to comparative examples. (A) of FIG. 2 schematically illustrates an example of energy band structures of respective layers of the organic electroluminescence device 1. (B) of FIG. 2 illustrates an example of absorption spectra of the hole transport layer 12 and the electron transport layer 14 in (A) of FIG. 2 as well as an example of an emission spectrum of the organic light-emitting layer 13 in (A) of FIG. 2. (A) of FIG. 3 schematically illustrates an example of energy band structures of respective layers of an organic electroluminescence device of Comparative Example A. (B) of FIG. 3 illustrates an example of absorption spectra of a hole transport layer 112 and an electron transport layer 114 in (A) of FIG. 3 as well as an example of an emission spectrum of an organic light-emitting layer 113 in (A) of FIG. 3. (A) of FIG. 4 schematically illustrates an example of energy band structures of respective layers of an organic electroluminescence device according to Comparative Example B. (B) of FIG. 4 illustrates an example of absorption spectra of the hole transport layer 12 and the electron transport layer 14 in (A) of FIG. 4 as well as an example of an emission spectrum of an organic light-emitting layer 213 in (A) of FIG. 4.

In each (A) of FIGS. 2, 3, and 4, the upper line indicates the lowest unoccupied molecular orbital (LUMO), and the lower line indicates the highest occupied molecular orbital (HOMO). The energy gap is an energy difference between HOMO level and LUMO level. The energy gap is also referred to as a band gap. When the organic light-emitting layer contains the dopant material, in particular, when the organic light-emitting layer contains two or more dopant materials, the energy gap of the organic light-emitting layer indicates an energy gap of a dopant material having the narrowest energy gap.

[Method for Measuring HOMO Level and LUMO Level]

Examples of the method for measuring the HOMO level may include atmospheric photoelectron spectroscopy, an electrochemical method such as cyclic voltammetry, and photoelectron spectroscopy (PES). In contrast, examples of the method for measuring the LUMO level may include inverse photoelectron spectroscopy (IPES) and a method of calculation from the HOMO level and an energy gap determined from an absorption end by means of photoabsorption spectroscopy. Alternatively, a calculation by molecular orbital method may also be used to calculate the HOMO level and the LUMO level.

The organic electroluminescence device of Comparative Example A may have a structure of a deposited organic electroluminescence device in which the hole transport layer 112 as a deposited film, the organic light-emitting layer 113 as a deposited film, and the electron transport layer 14 as a deposited film are stacked in this order. The organic electroluminescence device of Comparative Example B may have a structure of a coated organic electroluminescence device in which the hole transport layer 12 as a coated film, the organic light-emitting layer 213 as a coated film, and the electron transport layer 14 as a deposited film are stacked in this order.

The hole transport layer 112 may be an organic material layer configured by a deposited film. Examples of the material of the hole transport layer 112 may include an arylamine derivative, a triazole derivative, an oxadiazole derivative, an imidazole derivative, a polyarylalkane derivative, a pyrazoline derivative and a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, and a tetraphenylbenzene derivative. An energy gap Eg4 in the hole transport layer 112 may be wider than an energy gap Eg5 in the organic light-emitting layer 113.

The organic light-emitting layer 113 may be a blue organic light-emitting material layer configured by a deposited film using a blue organic light-emitting material different from that of the organic light-emitting layer 13. The material of the organic light-emitting layer 113 may be a single dopant material, but more preferably a combination of the host material and the dopant material. The host material serves a main function of transporting charge of electrons or holes, and the dopant material serves a light-emitting function. The host material contained in the organic light-emitting layer 113 is not only limited to a single type material, but may also be a combination of two or more types of materials. The amount of the dopant material contained in the organic light-emitting layer 113, relative to the host material contained in the organic light-emitting layer 113, may be preferably in a range from 0.01% by weight to 30% by weight, and more preferably from 0.01% by weight to 10% by weight.

Examples of the host material of the organic light-emitting layer 113 may include an amine compound, a condensed polycyclic aromatic compound, and a heterocyclic compound. Examples of the amine compound may include a monoamine derivative, a diamine derivative, a triamine derivative, and a tetraamine derivative. Example of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Example of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Examples of the dopant material of the organic light-emitting layer 113 may include a pyrene derivative, a fluoranthene derivative, an arylacetylene derivative, a fluorene derivative, a perylene derivative, an oxadiazole derivative, an anthracene derivative, and a chrysene derivative. In addition, a metal complex may also be used for the dopant material of the organic light-emitting layer 113. Examples of the metal complex may include a metal complex containing a ligand and an atom of metal such as iridium (Ir), platinum (Pt), osmium (Os), gold (Au), rhenium (Re), and ruthenium (Ru).

The energy gap Eg5 in the organic light-emitting layer 113 may be substantially equal to an energy gap Eg2 in the organic light-emitting layer 13. Accordingly, an emission wavelength of the organic light-emitting layer 113 may be substantially equal to an emission wavelength of the organic light-emitting layer 13.

The organic light-emitting layer 213 may be a blue organic light-emitting layer configured by a coated film using a blue organic light-emitting material different from those of the organic light-emitting layer 13 and the organic light-emitting layer 113. Examples of the material of the organic light-emitting layer 213 may include a polymeric blue light-emitting material such as polyfluorene and a derivative thereof, polyphenylene and a derivative thereof, and polyarylamine and a derivative thereof. An energy gap in the organic light-emitting layer 213 may be substantially equal to the energy gap in the organic light-emitting layer 13. Accordingly, an emission wavelength of the organic light-emitting layer 213 may be substantially equal to the emission wavelength of the organic light-emitting layer 13.

As described above, the hole transport layer 12 may be configured by the coated film, and may be a hole transport layer insolubilized with the insoluble function. Therefore, an energy gap Eg1 in the hole transport layer 12 may be narrower than the energy gap Eg4 in the hole transport layer 112. As a result, the energy gap Eg1 in the hole transport layer 12 may not be an energy gap sufficiently larger than the energy gap Eg2 in the organic light-emitting layer 13, and, for example, may be substantially equal to the energy gap Eg2 in the organic light-emitting layer 13.

As described above, the organic light-emitting layer 13 may be a deposited film, and may be made of an organic light-emitting material having hole mobility that is larger than electron mobility. In other words, the organic light-emitting layer 13 may be a layer made of a material having a higher hole transporting property, and may also be a layer having hole mobility that is larger than electron mobility. Consequently, a light emission region 13A in the organic light-emitting layer 13 may be positioned in a region on electron-injection side, i.e., electron transport layer 14 side inside the organic light-emitting layer 13. In other words, the light emission region 13A in the organic light-emitting layer 13 may be positioned in a region distant from a region on hole-injection side, i.e., hole transport layer 12 side inside the organic light-emitting layer 13. That is, the organic light-emitting layer 13 may have the light emission region 13A on electron transport layer 14 side inside the organic light-emitting layer 13. The light emission region 13A may be preferably positioned in a region of the organic light-emitting layer 13 in the vicinity of an interface with respect to the electron transport layer 14. As a result, deactivation due to the hole transport layer 12 is less likely to occur despite a fact that at least a portion of an emission spectrum 13a in the organic light-emitting layer 13 overlaps an absorption spectrum 12a in the hole transport layer 12.

As described above, the electron transport layer 14 may be configured by a deposited film. Thus, it is possible to easily select, as the material of the electron transport layer 14, a material having an energy gap $Eg3$ that is wider than the energy gap $Eg2$ in the organic light-emitting layer 13. In other words, the energy gap $Eg3$ of the electron transport layer 14 is larger than the energy gap $Eg2$ of the organic light-emitting layer 13. Consequently, deactivation due to the electron transport layer 14 is less likely to occur because the emission spectrum 13a in the organic light-emitting layer 13 does not overlap an absorption spectrum 14a in the electron transport layer 14.

As described above, in Comparative Example B, the organic light-emitting layer 213 may be a polymeric blue organic light-emitting material layer configured by a coated film of the polymeric blue organic light-emitting material. Further, an energy gap $Eg6$ in the organic light-emitting layer 213 may be substantially equal to the energy gap $Eg2$ in the organic light-emitting layer 13. At this time, the deactivation due to the hole transport layer 12 may occur because at least a portion of an emission spectrum 213a in the organic light-emitting layer 213 overlaps the absorption spectrum 12a in the hole transport layer 12.

In Comparative Example A, deactivation due to the hole transport layer 112 is less likely to occur in the first place, because an emission spectrum 113a in the organic light-emitting layer 113 does not overlap an absorption spectrum 112a in the hole transport layer 112. In Comparative Example A, however, the hole transport layer 112 and the organic light-emitting layer 113 may be each configured by the deposited film, thus resulting in disadvantages such as high cost, a complicated manufacturing process, and difficulty in forming the layers at a large area scale, compared to the organic electroluminescence device of Comparative Example B and the organic electroluminescence device 1 of the present embodiment.

Description is next given of a light emission region of each of the organic light-emitting layers. The light emission region indicates a distribution of excitons, which are generated in the organic light-emitting layer, inside the organic light-emitting layer. FIGS. 5A to 5D each illustrate an example of the light emission region inside the organic light-emitting layer. In each of FIGS. 5A to 5D, the organic light-emitting layer is separated at the middle to be divided into two regions, i.e., a region on side where the hole transport layer is disposed and a region on side where the electron transport layer is disposed. As used herein, the wording "the light emission region lies on electron transport layer side" refers to, for example, a state in which 50% or more of the light emission region inside the organic light-emitting layer exists in the region on side where the electron transport layer is disposed, as illustrated in FIG. 5A. As used herein, the wording "the light emission region lies on hole transport layer side" refers to, for example, a state in which 50% or more of the light emission region inside the organic light-emitting layer exists in the region on side where the hole transport layer is disposed, as illustrated in FIG. 5B. As used herein, the wording "the light emission region is positioned in the vicinity of an interface with respect to the electron transport layer" refers to, for example, a state in which 90% or more of the light emission region inside the organic light-emitting layer exists on side where the electron transport layer is disposed, as illustrated in FIG. 5C. As used herein, the wording "the light emission region is positioned in the vicinity of an interface with respect to the hole transport layer" refers to, for example, a state in which 90% or more of the light emission region inside the organic light-emitting layer exists in the region on side where the hole transport layer is disposed, as illustrated in FIG. 5D. It is to be noted that FIGS. 5A to 5D each illustrate an example of the light emission region. For example, there is also a case where a peak of the light emission region is positioned inside the organic light-emitting layer instead of being positioned at the interface of the organic light-emitting layer.

In order to achieve a superior device performance even in the case of the coated organic electroluminescence device, the inventors focused attention on the light emission region inside the organic light-emitting layer to evaluate the device performance of the organic electroluminescence device. More specifically, evaluation was made for each light emission efficiency of a case where the light emission region 13A is set on electron transport layer 14 side of the organic light-emitting layer 13 and of a case where the light emission region 13A is set on hole transport layer 12 side of the organic light-emitting layer 13, in the organic electroluminescence device 1 of FIG. 1. Description is given below of experiments and evaluation results of the device performance. It is to be noted that the disclosure is not limited to the contents described in the examples.

Example 1

[Organic Electroluminescence Device in which Light Emission Region 13A Lies on Electron Transport Layer 14 Side]

As the organic electroluminescence device of Example 1, a hole injection layer, a hole transport layer, an organic light-emitting layer, an electron transport layer, an electron injection layer, and aluminum were stacked in this order on a glass substrate on which an ITO transparent electrode was patterned. The organic light-emitting layer was set to have a film thickness of 40 nm to 50 nm.

Comparative Example 1

[Organic Electroluminescence Device in which Light Emission Region Lies on Hole Transport Layer Side]

An organic electroluminescence device of Comparative Example 1 was prepared, in which a patterned ITO transparent electrode, a hole injection layer, a hole transport layer, an organic light-emitting layer, an electron transport layer, an electron injection layer, and aluminum were stacked in this order on a glass substrate. The organic light-emitting layer was set to have a film thickness of 40 nm to 50 nm. The organic light-emitting layer of Comparative Example 1 is a coated film, and is made of an organic light-emitting material having hole mobility that is smaller than electron mobility. In other words, the organic light-emitting layer of Comparative Example 1 is a layer made of a material having a higher electron transporting property, and is a layer having hole mobility that is smaller than electron mobility. In Comparative Example 1, a constituent material of each of the hole injection layer, the hole transport layer, the electron transport layer, and the electron injection layer is a material in accordance with the constituent material of the organic light-emitting layer of Comparative Example 1. In contrast, the organic light-emitting layer of Example 1 is a coated film, and may be made of an organic light-emitting material having hole mobility that is larger than electron mobility. In other words, the organic light-emitting layer of Example 1 may be a layer made of a material having a higher hole transporting property, and may be a layer having hole mobility that is larger than electron mobility. In Example 1, a constituent material of each of the hole injection layer, the hole transport layer, the electron transport layer, and the electron injection layer may be a material in accordance with the constituent material of the organic light-emitting layer of Example 1. Accordingly, the organic electroluminescence device of Example 1 has the light emission region that is positioned on electron transport layer side, whereas the organic electroluminescence device of Comparative Example 1 has the light emission region that is positioned on hole transport layer side. The method for varying the light emission region may be, for example, a method in which a ratio between the host material and the dopant material contained in the organic light-emitting layer is adjusted to allow the hole mobility to be larger than the electron mobility in the organic light-emitting layer.

Description is given of a method for evaluating the light emission region inside the organic light-emitting layer of each of the organic electroluminescence devices fabricated in Example 1 and Comparative Example 1.

In the present experiment, viewing angle characteristics of the organic electroluminescence device were evaluated to analyze the light emission region inside the organic light-emitting layer. Table 1 below illustrates variations $\Delta y(30°)=y(0°)-y(30°)$ and $\Delta y(60°)=y(0°)-y(60°)$ which are respective variations of light emission chromaticity $y(30°)$ and $y(60°)$ from front chromaticity $y(0°)$ measured respectively in directions of 30° and 60° when a direction perpendicular to the substrate of the organic electroluminescence device is set at 0° (i.e., a frontal direction to an emission surface). The measurement was performed using a spectral radiance meter.

[Actual Measurement of Variation of Chromaticity y from Front Chromaticity]

TABLE 1

|  | $\Delta y(30°)$ | $\Delta y(60°)$ |
| --- | --- | --- |
| Example 1 | −0.013 | −0.020 |
| Comparative Example 1 | −0.024 | −0.052 |

Next, optical calculation of viewing angle characteristics was performed using optical simulation for each device structure of the organic electroluminescence devices of Example 1 and Comparative Example 1. Examples of the light emission region inside the organic light-emitting layer may include a Gaussian distribution and an exponential distribution. The Gaussian distribution is a distribution represented by Expression (1). The exponential distribution is a distribution represented by Expression (2).

$$\text{Exp.}(-(a-a0)^2/2\sigma^2) \qquad \text{Expression (1)}$$

In Expression (1), "a" denotes a position inside the organic light-emitting layer, a0 denotes a peak position of the light emission region inside the organic light-emitting layer, and σ denotes a half-value width.

$$\text{Exp.}(-|b-b0|/w) \qquad \text{Expression (2)}$$

In Expression (2), "b" denotes a position inside the organic light-emitting layer, b0 denotes a peak position of the light emission region inside the organic light-emitting layer, and w denotes a constant that specifies the width of the light emission region.

[Calculation 1 in a Case where Light Emission Region Lies on Electron Transport Layer Side]
(Optical Calculation 1)

Calculation was performed using the Gaussian distribution of Expression (1) for a model in which the peak of the light emission region is positioned on side, of the organic light-emitting layer, where the electron transport layer is disposed. The position "a" was set at such a position as to allow the ratio of a distance from an interface between the organic light-emitting layer and the hole transport layer to a distance from an interface between the organic light-emitting layer and the electron transport layer to be 8:2. The half-value width σ was set at 5 nm.

[Calculation 2 in a Case where Light Emission Region Lies on Electron Transport Layer Side]
(Optical Calculation 2)

Calculation was performed using the exponential distribution of Expression (2) for a model in which the peak of the light emission region is positioned at an interface between the organic light-emitting layer and the electron transport layer. The position "b" was set at the interface between the organic light-emitting layer and the electron transport layer. The constant w was set at 5 nm.

[Calculation 3 in a Case where Light Emission Region Lies on Hole Transport Layer Side]
(Optical Calculation 3)

Calculation was performed using the Gaussian distribution of Expression (1) for a model in which the peak of the light emission region is positioned on side, of the organic light-emitting layer, where the hole transport layer is disposed. The position "a" was set at such a position as to allow the ratio of a distance from the interface between the organic light-emitting layer and the hole transport layer to a distance from the interface between the organic light-emitting layer and the electron transport layer to be 2:8. The half-value width σ was set at 5 nm.

[Calculation 4 in a Case where Light Emission Region Lies on Hole Transport Layer Side]
(Optical Calculation 4)

Calculation was performed using the exponential distribution of Expression (2) for a model in which the peak of the light emission region is positioned at an interface between the organic light-emitting layer and the hole transport layer. The position "b" was set at the interface between the organic light-emitting layer and the hole transport layer. The constant w was set at 5 nm.

Table 2 below illustrates calculation results of Optical Calculations 1, 2, 3, and 4. It is appreciated, from Tables 1 and 2, that optical simulation results coincide well with experimental results. Example 1 well coincides with Optical Calculation 2, in particular, among Optical Calculations 1 and 2 in cases where the light emission region lies on electron transport layer side. Further, Comparative Example 1 well coincides with Optical Calculation 4, in particular, among Optical Calculations 3 and 4 in cases where the light emission region lies on hole transport layer side. Accordingly, Example 1 that well coincides with Optical Calculation 2 in the case of having the light emission region on electron transport layer side demonstrates that the light emission region inside the organic light-emitting layer lies on electron transport layer side. Further, Comparative Example 1 that well coincides with Optical Calculation 4 in the case of having the light emission region on hole transport layer side demonstrates that the light emission region inside the organic light-emitting layer lies on hole transport layer side.

Moreover, the organic light-emitting layer in Example 1 may have a film thickness of 40 nm to 50 nm. Therefore, it is appreciated that 90% or more of the light emission region in Optical Calculation 2 exists on side, of the organic light-emitting layer, where the electron transport layer is disposed, and thus the light emission region in Optical Calculation 2 lies in the vicinity of the electron transport layer. Further, the organic light-emitting layer in Comparative Example 1 has a film thickness of 40 nm to 50 nm. Therefore, it is appreciated that 90% or more of the light emission region in Optical Calculation 4 exists on side, of the organic light-emitting layer, where the hole transport layer is disposed, and thus the light emission region in Optical Calculation 4 lies in the vicinity of the hole transport layer.

[Variation of Chromaticity y from Front Chromaticity Calculated by Optical Simulation]

TABLE 2

|  | Δy(30°) | Δy(60°) |
|---|---|---|
| Optical Calculation 1 | −0.013 | −0.023 |
| Optical Calculation 2 | −0.012 | −0.021 |
| Optical Calculation 3 | −0.025 | −0.057 |
| Optical Calculation 4 | −0.024 | −0.053 |

Table 3 below illustrates an example of each light emission efficiency of the organic electroluminescence devices of Example 1 and Comparative Example 1. The light emission efficiency of Example 1 of Table 3 is a standardized value of the experimental value of the light emission efficiency of Example 1 with the experimental value of the light emission efficiency of Comparative Example 1. The light emission efficiency of Comparative Example 1 of Table 3 is a standardized value of the experimental value of the light emission efficiency of Comparative Example 1 with the experimental value of the light emission efficiency of Comparative Example 1. It is appreciated, from Table 3, that the light emission efficiency is increased by about two times by shifting the light emission region from hole transport layer side to electron transport layer side.

[Comparison of Light Emission Efficiency (EQE)]

TABLE 3

|  | Light Emission Efficiency |
|---|---|
| Example 1 | 2.19 |
| Comparative Example 1 | 1.00 |

As a result of intensive study on the basis of the above-described experimental results and evaluations, the inventors have obtained the following knowledge. That is, by allowing the light emission region inside the organic light-emitting layer to be positioned on electron transport layer side, more preferably in the vicinity of an interface with respect to the electron transport layer, it becomes possible to suppress movement of energy from the organic light-emitting layer to the hole transport layer, and to suppress light extinction that occurs between the organic light-emitting layer and the hole transport layer, thus improving the light emission efficiency in the coated organic electroluminescence device.

[Other Features]

Description is given of other example features in the organic electroluminescence device 1 of the present embodiment.

(Feature 1)

Evaluation was made of a hole current and an electron current in the organic light-emitting layer 13 in the present embodiment. The hole current is generated by flow of holes, and the electron current is generated by flow of electrons. However, it is difficult to separate the hole current from the electron current in the organic electroluminescence device in which holes and electrons flow at the same time. Therefore, a single charge device was fabricated for evaluation. A hole only device (HOD) was fabricated to evaluate the hole current. The HOD of Example 1 and the HOD of Comparative Example 1 each have a device structure made of gold changed from aluminum, in which the organic light-emitting layer of the organic electroluminescence device of each of Example 1 and Comparative Example 1 is set to have a film thickness of 75 nm to 85 nm, and the electron transport layer and the electron injection layer are removed. A hole current Ih is defined as a current value in the case where a predetermined voltage is applied to the HOD that allows only holes to flow. An electron only device (EOD) was fabricated to evaluate the electron current. The EOD of Example 1 and the EOD of Comparative Example 1 each have a device structure, in which the organic light-emitting layer of the organic electroluminescence device of each of Example 1 and Comparative Example 1 is set to have a film thickness of 75 nm to 85 nm, and the hole injection layer and the hole transport layer are removed. An electron current Ie is defined as a current value in the case where a predetermined voltage is applied to the EOD that allows only electrons to flow.

Table 4 below illustrates an example of a current density (unit: mA/cm$^2$) of the HOD and the EOD of each of Example 1 and Comparative Example 1, and an example of evaluation of a quotient of the hole current Ih divided by the electron current Ie, in a case where a voltage of 5 V is applied to the HOD and the EOD of each of Example 1 and Comparative Example 1. The upper row in Table 4 illustrates the current density of the HOD and the EOD of Example 1 as well as the quotient of the hole current Ih divided by the electron current Ie. The lower row in Table 4 illustrates the current density of the HOD and the EOD of Comparative Example 1 as well as the quotient of the hole current Ih divided by the electron current Ie. It is appreciated, from Table 4, that the HOD of Example 1 has a current density that is larger than a current density of the EOD of Example 1, and that the quotient of the hole current Ih divided by the electron current Ie is larger than one. It is also appreciated, from Table 4, that the HOD of Comparative Example 1 has a current density that is smaller than a current density of the EOD of Comparative Example 1, and that the quotient of the hole current Ih divided by the electron current Ie is smaller than one. Accordingly, it may be presumed that, in Example 1, the hole current in the organic light-emitting layer is larger than the electron current in the organic light-emitting layer, thus allowing the light emission region to lie on electron transport layer side. Further, it may be said, in Example 1, that the organic light-emitting layer is configured to allow the position of the light emission region inside the organic light-emitting layer to come closer to the electron transport layer, as the quotient of the hole current Ih divided by the electron current Ie becomes larger. Furthermore, it may be presumed that, in Comparative Example 1, the light emission region lies on hole transport layer side because the hole current is smaller than the electron current. These views support the presumption that the light emission region of Example 1 lies on electron transport layer side, and that the light emission region of Comparative Example 1 lies on hole transport layer side. Accordingly, the coated organic electroluminescence device may preferably have a configuration in which the hole current Ih in the organic light-emitting layer is larger than the electron current Ie in the organic light-emitting layer, i.e., the quotient of the hole current Ih divided by the electron current Ie is larger than one.

TABLE 4

|  | Current Density of HOD | Current Density of EOD | 1h/1e |
|---|---|---|---|
| Example 1 | 2.0 | 0.3 | 6.7 |
| Comparative Example 1 | 1.9 | 7.0 | 0.3 |

(Feature 2)

Evaluation was made of the hole mobility and the electron mobility in the organic light-emitting layer 13 in the present embodiment. Examples of the method for evaluating the mobility may include a method of determining the mobility from current-voltage characteristics of a space-charge limited current, an evaluation method using a time-of-flight method in which a predetermined device is irradiated with pulse light to determine the mobility from a time during which a carrier travels between electrodes, and an evaluation method using impedance spectroscopy in which the mobility is determined from a transit-time effect in the case of applying an alternating voltage to the organic electroluminescence device. It is difficult to separate the hole mobility from the electron mobility in the organic electroluminescence device in which holes and electrons flow at the same time. Therefore, a single charge device was fabricated for evaluation. The HOD was fabricated to evaluate the hole mobility. The HOD of Example 1 and the HOD of Comparative Example 1 each have a device structure made of gold changed from aluminum, in which the organic light-emitting layer of the organic electroluminescence device of each of Example 1 and Comparative Example 1 is set to have a film thickness of 75 nm to 85 nm, and the electron transport layer and the electron injection layer are removed. Hole mobility $\mu h$ is defined as mobility in the case where a predetermined voltage is applied to the HOD that allows only holes to flow. The EOD was fabricated to evaluate the electron mobility. The EOD of Example 1 and the EOD of Comparative Example 1 each have a device structure, in which the organic light-emitting layer of the organic electroluminescence device of each of Example 1 and Comparative Example 1 is set to have a film thickness of 75 nm to 85 nm, and the hole injection layer and the hole transport layer are removed. Electron mobility $\mu e$ is defined as mobility in the case where a predetermined voltage is applied to the EOD that allows only electrons to flow.

Table 5 below illustrates an example of mobility in the organic light-emitting layer of the HOD and the EOD of each of Example 1 and Comparative Example 1, and an example of evaluation of a quotient of the hole mobility $\mu h$ divided by the electron mobility $\mu e$, in a case where a voltage of 5 V is applied to the HOD and the EOD of each of Example 1 and Comparative Example 1. The upper row in Table 5 illustrates the mobility in the organic light-emitting layer of the HOD and the EOD of Example 1 as well as the quotient of the hole mobility $\mu h$ divided by the electron mobility $\mu e$. The lower row in Table 5 illustrates the mobility in the organic light-emitting layer of the HOD and the EOD of Comparative Example 1 as well as the quotient of the hole mobility $\mu h$ divided by the electron mobility $\mu e$. It is appreciated, from Table 5, that the hole mobility in the organic light-emitting layer of the HOD of Example 1 is larger than the electron mobility in the organic light-emitting layer of the EOD of Example 1, and that the quotient of the hole mobility $\mu h$ divided by the electron mobility $\mu e$ is larger than one. It is also appreciated, from Table 5, that the hole mobility in the organic light-emitting layer of the HOD of Comparative Example 1 is smaller than the electron mobility in the organic light-emitting layer of the EOD of Comparative Example 1, and that the quotient of the hole mobility $\mu h$ divided by the electron mobility $\mu e$ is smaller than one. Accordingly, it may be presumed that, in Example 1, the hole mobility is larger than the electron mobility, thus allowing the light emission region to lie on electron transport layer side. Further, it may be presumed that, in Comparative Example 1, the light emission region lies on hole transport layer side because the hole mobility is smaller than the electron mobility. These views support the presumption that the light emission region of Example 1 lies on electron transport layer side, and that the light emission region of Comparative Example 1 lies on hole transport layer side. Accordingly, the coated organic electroluminescence device may preferably have a configuration in which the hole mobility $\mu h$ is larger than the electron mobility $\mu e$, i.e., the quotient of the hole mobility $\mu h$ divided by the electron mobility $\mu e$ is larger than one.

TABLE 5

|  | Mobility in HOD | Mobility in EOD | $\mu h/\mu e$ |
|---|---|---|---|
| Example 1 | 1.3E−10 | 9.3E−12 | 14.4 |
| Comparative Example 1 | 2.1E−10 | 3.7E−10 | 0.6 |

(Feature 3)

Evaluation was made of a molecular orientation degree of the organic light-emitting material in the organic light-emitting layer 13 in the present embodiment. Examples of the method for evaluating the molecular orientation degree may include analysis of optical anisotropy using spectroscopic ellipsometry. The evaluation of the molecular orientation degree was made of a single film of the organic light-emitting layer formed on quartz glass. As a parameter indicating the molecular orientation degree, a parameter S represented by Expression (3) and a parameter S' represented by Expression (4) may be used.

$$S=(ke-ko)/(ke+2\times ko) \qquad \text{Expression (3)}$$

$$S'=(2\times ko)/(ke+2\times ko) \qquad \text{Expression (4)}$$

In Expression (3) and Expression (4), ko denotes an extinction coefficient in a film-plane direction of the organic light-emitting layer in an emission wavelength, and ke denotes an extinction coefficient in a film-thickness direction of the organic light-emitting layer in an emission wavelength. Here, for example, the parameter S ranges from −1 to 0.5 (−1<S<0.5). When S is equal to −1 (S=−1), the molecular orientation is completely horizontal relative to the substrate. When S is equal to 0.5 (S=0.5), the molecular orientation is completely vertical relative to the substrate. When S is equal to 0 (S=0), the molecular orientation is completely disorderly, i.e., random. Likewise, the parameter S' ranges from 0 to 1 (0<S'<1). When S' is equal to 1 (S'=1), the molecular orientation is completely horizontal relative to the substrate. When S' is equal to 0 (S'=0), the molecular orientation is completely vertical relative to the substrate. When S' is equal to 0.66 . . . , i.e., ⅔ (S'=⅔), the molecular orientation is completely disorderly, i.e., random.

Table 6 below illustrates an example of a case of evaluating the parameter S' indicating the molecular orientation degree of the organic light-emitting layer of each of Example 1 and Comparative Example 1 formed on a quartz substrate. The upper row of Table 6 illustrates a value of the parameter S' indicating the molecular orientation degree of the organic light-emitting layer of Example 1, and the lower row of Table 6 illustrates a value of the parameter S' indicating the molecular orientation degree of the organic light-emitting layer of Comparative Example 1. It is appreciated, from Table 6, that the value 0.675 of the parameter S' of the organic light-emitting layer of Example 1 is very close to 0.66 . . . , i.e., ⅔, and thus the molecular orientation of the organic light-emitting layer of Example 1 is disorderly, i.e., random. It is also appreciated, from Table 6, that the value of the parameter S' of the organic light-emitting layer of Comparative Example 1 is 0.749, and thus the molecular orientation of the organic light-emitting layer of Comparative Example 1 is more horizontal relative to the substrate than the molecular orientation of the organic light-emitting layer of Example 1. Accordingly, the molecular orientation of the organic light-emitting layer is disorderly, i.e., random in Example 1, whereas, in Comparative Example 1, the molecular orientation of the organic light-emitting layer is more horizontal relative to the substrate than that of Example 1. It is presumed that the light emission region is changed due to such a difference in the molecular orientation degree, i.e., the light emission region is changed by changing a film property. The change in the film property may be generated by difference in the material of the organic light-emitting layer. Accordingly, it is presumed that the disorderly, i.e., random molecular orientation of the organic light-emitting layer in Example 1 causes the light emission region to be shifted to electron transport layer side. It is also presumed that the molecular orientation of the organic light-emitting layer relative to the substrate in Comparative Example 1 is more horizontal than the molecular orientation of the organic light-emitting layer of Example 1, which causes the light emission region to be shifted to hole transport layer side. Accordingly, in the coated organic electroluminescence device, it is preferable for the parameter S' indicating the molecular orientation degree to be larger than 0.66 and to be smaller than 0.75 (0.66<S'<0.75). In this case, the direction of the molecular orientation of the organic light-emitting material in the organic light-emitting layer of Example 1 may be determined to allow the ratio of x (or y):z to range from 1:1 to 1.5:1, where the x-axis and the y-axis are defined as directions orthogonal to each other in the film-plane direction of the organic light-emitting layer, and the z-axis is defined as the film-thickness direction of the organic light-emitting layer. More preferably, the parameter S' indicating the molecular orientation degree may be larger than 0.66 and smaller than 0.72 (0.66<S'<0.72). In this case, the direction of the molecular orientation of the organic light-emitting material in the organic light-emitting layer of Example 1 may be determined to allow the ratio of x (or y):z to range from 1:1 to 1.29:1. Still more preferably, the parameter S' may be larger than 0.66 and smaller than 0.69 (0.66<S'<0.69). In this case, the direction of the molecular orientation of the organic light-emitting material in the organic light-emitting layer of Example 1 may be determined to allow the ratio of x (or y):z to range from 1:1 to 1.12:1. In other words, the organic light-emitting layer of Example 1 is configured to allow the position of the light emission region inside the organic light-emitting layer of Example 1 to come closer to the electron transport layer, as the parameter S' indicating the molecular orientation degree comes closer to 0.66.

TABLE 6

| | S' |
|---|---|
| Organic Light-Emitting Layer of Example 1 | 0.675 |
| Organic Light-Emitting Layer of Comparative Example 1 | 0.749 |

[Effects]
Description is next given of effects of the organic electroluminescence device 1 of the present embodiment.
[Detailed Issues]
In recent years, attention has been focused on formation of layers such as the organic light-emitting layer through a simple manufacturing process using coating that enables forming the layers easily at a large area scale. When forming the layers such as the organic light-emitting layer using coating, it is necessary to insolubilize an underlayer, for example. When forming the hole transport layer as the underlayer also by coating, for example, there may be a method of using a material having an insoluble function as a constituent material of the hole transport layer. When using, for the hole transport layer, a material provided with functions of solubility and insolubilization, however, the material provided with the functions of solubility and insolubilization incorporates, in a molecular structure thereof, a group such as a soluble group, a cross-linking group, and a thermal dissociation soluble group, and thus conjugation is extended, causing an energy gap to be narrower. Accordingly, particularly the blue organic electroluminescence device may have a lowered device performance.

In contrast, in the present embodiment, the light emission region in the organic light-emitting layer 13 may lie on electron transport layer side. As a result, for example, even when the hole transport layer 12 is a hole transport layer insolubilized with the insoluble function, i.e., even when the hole transport layer 12 is made of a material having the insoluble function, deactivation due to the hole transport layer 12 is less likely to occur. Thus, it becomes possible to prevent the device performance from being lowered even in the case of the coated organic electroluminescence device configured by the hole transport layer 12 as a coated film and the organic light-emitting layer 13 as a coated film.

The energy gap Eg1 in the hole transport layer 12 is substantially equal to the energy gap Eg2 of a dopant contained in the organic light-emitting layer 13. Thus, there is a case where deactivation may occur due to the hole transport layer 12. In the present embodiment, however, the light emission region 13A may lie on electron transport layer side inside the organic light-emitting layer 13, thus making the deactivation due to the hole transport layer 12 less likely to occur. Therefore, it becomes possible to prevent the device performance from being lowered even when the energy gap Eg1 in the hole transport layer 12 is substantially equal to the energy gap Eg2 of the dopant contained in the organic light-emitting layer 13.

At least a portion of the emission spectrum 13a in the organic light-emitting layer 13 overlaps the absorption spectrum 12a in the hole transport layer 12. In the present embodiment, however, the light emission region 13A may lie on electron transport layer side inside the organic light-emitting layer 13, thus making the deactivation due to the hole transport layer 12 less likely to occur. Therefore, it becomes possible to prevent the device performance from being lowered even when at least a portion of the emission spectrum 13a in the organic light-emitting layer 13 overlaps the absorption spectrum 12a in the hole transport layer 12.

In the present embodiment, the light emission region 13A lies on electron transport layer side. Thus, there is a case where deactivation may occur due to the electron transport layer 14. In the present embodiment, however, the electron transport layer 14 may be configured by a deposited film, thus making it possible to easily select, as the constituent material of the electron transport layer 14, a material having the energy gap Eg3 that is wider than the energy gap Eg2 in the organic light-emitting layer 13. Consequently, it becomes possible to prevent the device performance from being lowered, because the energy gap Eg3 in the electron transport layer 14 is wider than the energy gap Eg2 of the dopant contained in the organic light-emitting layer 13.

The emission spectrum 13a in the organic light-emitting layer 13 does not overlap the absorption spectrum 14a in the electron transport layer 14. Therefore, in the present embodiment, the light emission region 13A lies on electron transport layer side inside the organic light-emitting layer 13, and thus deactivation due to the electron transport layer 14 is less likely to occur. Consequently, it becomes possible to prevent the device performance from being lowered, because the emission spectrum 13a in the organic light-emitting layer 13 does not overlap the absorption spectrum 14a in the electron transport layer 14.

In the present embodiment, when the hole current Ih in the organic light-emitting layer 13 is larger than the electron current Ie in the organic light-emitting layer 13, the light emission region 13A lies on electron transport layer side. Therefore, the deactivation due to the hole transport layer 12 is less likely to occur, thus making it possible to prevent the device performance from being lowered. Further, in the present embodiment, when the quotient of the hole current Ih divided by the electron current Ie is larger than 5, the light emission region 13A lies in the vicinity of an interface with respect to the electron transport layer. Therefore, the deactivation due to the hole transport layer 12 is still less likely to occur, thus making it possible to further prevent the device performance from being lowered.

In the present embodiment, when the hole mobility μh in the organic light-emitting layer 13 is larger than the electron mobility μe in the organic light-emitting layer 13, the light emission region 13A lies on electron transport layer side. Therefore, the deactivation due to the hole transport layer 12 is less likely to occur, thus making it possible to prevent the device performance from being lowered. Further, in the present embodiment, when the quotient of the hole mobility μh divided by the electron mobility μe is larger than 10, the light emission region 13A lies in the vicinity of an interface with respect to the electron transport layer. Therefore, the deactivation due to the hole transport layer 12 is still less likely to occur, thus making it possible to further prevent the device performance from being lowered.

In the present embodiment, when the organic light-emitting layer 13 is configured to allow the position of the light emission region 13A inside the organic light-emitting layer 13 to come closer to side where the electron transport layer is disposed, as the quotient of the hole current Ih divided by the electron current Ie becomes larger, the deactivation due to the hole transport layer 12 is less likely to occur, thus making it possible to surely prevent the device performance from being lowered.

In the present embodiment, when the organic light-emitting layer 13 is configured to allow the position of the light emission region 13A inside the organic light-emitting layer 13 to come closer to side where the electron transport layer is disposed, as the quotient of the hole mobility μh divided by the electron mobility μe becomes larger, the deactivation due to the hole transport layer 12 is less likely to occur, thus making it possible to surely prevent the device performance from being lowered.

In the present embodiment, when the parameter S' indicating the molecular orientation degree in the organic light-emitting material that constitutes the organic light-emitting layer satisfies a range larger than 0.66 and smaller than 0.75 (0.66<S'<0.75), the direction of the molecular orientation of the organic light-emitting material in the organic light-emitting layer 13 may be determined to allow the ratio of x (or y):z to range from 1:1 to 1.5:1, where the x-axis and the y-axis are defined as directions orthogonal to each other in the film-plane direction of the organic light-emitting layer 13, and the z-axis is defined as the film-thickness direction of the organic light-emitting layer 13.

More preferably, in the present embodiment, the parameter S' indicating the molecular orientation degree in the organic light-emitting material that constitutes the organic light-emitting layer may be in a range larger than 0.66 and smaller than 0.72 (0.66<S'<0.72). In this case, the direction of the molecular orientation of the organic light-emitting material in the organic light-emitting layer 13 may be determined to allow the ratio of x (or y):z to range from 1:1 to 1.29:1.

Still more preferably, the parameter S' may be in a range larger than 0.66 and smaller than 0.69 (0.66<S'<0.69). In this case, the direction of the molecular orientation of the organic light-emitting material in the organic light-emitting layer 13 may be determined to allow the ratio of x (or y):z to range from 1:1 to 1.12:1.

It is presumed that the light emission region is changed due to such a difference in the molecular orientation degree, i.e., the light emission region is changed by changing the film property. In the present embodiment, the orientation of the organic light-emitting material 13M that constitutes the organic light-emitting layer 13 is disorderly, i.e., random, and thus the light emission region 13A inside the organic light-emitting layer 13 lies on electron transport layer side. Therefore, the deactivation due to the hole transport layer 12 is less likely to occur, thus making it possible to prevent the device performance from being lowered. Further, in the present embodiment, the orientation of the organic light-emitting material 13M that constitutes the organic light-emitting layer 13 is disorderly, i.e., random, and thus the light emission region 13A inside the organic light-emitting layer 13 lies in the vicinity of an interface with respect to the electron transport layer. Therefore, the deactivation due to the hole transport layer 12 is still less likely to occur, thus making it possible to further prevent the device performance from being lowered.

In the present embodiment, when the organic light-emitting layer 13 is configured to allow the position of the light emission region 13A inside the organic light-emitting layer 13 to come closer to side where the electron transport layer is disposed, as the molecular orientation degree in the organic light-emitting material that constitutes the organic light-emitting layer becomes more random, in other words, as the parameter S' comes closer to 0.66 . . . , i.e., ⅔, the deactivation due to the hole transport layer 12 is less likely to occur, thus making it possible to surely prevent the device performance from being lowered.

2. Second Embodiment

[Configuration]

FIG. 6 illustrates an example of an outline configuration of an organic electroluminescence unit 2 according to a second embodiment of the disclosure. FIG. 7 illustrates an example of a circuit configuration of each pixel 21 provided in the organic electroluminescence unit 2. The organic electroluminescence unit 2 may include, for example, a display panel 20, a controller 30, and a driver 40. The driver 40 may be mounted on an outer edge portion of the display panel 20. The display panel 20 may include a plurality of pixels 21 that are arranged in matrix. The controller 30 and the driver 40 may each drive the display panel 20 on the basis of a synchronization signal Tin and an image signal Din inputted from the outside.

(Display Panel 20)

The display panel 20 may display an image on the basis of the synchronization signal Tin and the image signal Din inputted from the outside, in response to active-matrix driving performed on each pixel 21 by the controller 30 and the driver 40. The display panel 20 may include a plurality of scanning lines WSL and a plurality of power supply lines DSL both extending in a row direction, a plurality of signal lines DTL extending in a column direction, and a plurality of pixels 21 disposed in matrix.

The scanning lines WSL may be each used to select each of the pixels 21. The scanning lines WSL may each supply each of the pixels 21 with a selection pulse to thereby select each of the pixels 21 on a predetermined-unit basis (e.g., on a pixel-row basis). The signal lines DTL may be each used to supply each of the pixels 21 with a signal voltage Vsig based on the image signal Din. Specifically, the signal lines DTL may each supply each of the pixels 21 with a data pulse including the signal voltage Vsig. The power supply lines DSL may each supply each of the pixels 21 with electricity.

The plurality of pixels 21 may include, for example, a plurality of pixels 21 that emit red light, a plurality of pixels 21 that emit green light, and a plurality of pixels 21 that emit blue light. It is to be noted that the plurality of pixels 21 may further include a plurality of pixels 21 that emit light of other colors such as white light and yellow light, for example.

Each of the signal lines DTL may be coupled to an output end of a horizontal selector 41 described later. For example, the plurality of signal lines DTL may be assigned to respective pixel columns. Each of the scanning lines WSL may be coupled to an output end of a write scanner 42 described later. For example, the plurality of scanning lines WSL may be assigned to respective pixel rows. Each of the power supply lines DSL may be coupled to an output end of a power supply. For example, the plurality of power supply lines DSL may be assigned to respective pixel rows.

Each of the pixels 21 may include, for example, a pixel circuit 21A and an organic electroluminescence device 21B. The organic electroluminescence device 21B may be, for example, the organic electroluminescence device 1 of the foregoing embodiment. One or more of the plurality of pixels 21 included in the display panel 20 may include the organic electroluminescence device 1 of the foregoing embodiment. In other words, one or more of the plurality of organic electroluminescence devices 21B included in the display panel 20 may be configured by the organic electroluminescence device 1 of the foregoing embodiment.

For example, each of the pixels 21 that emit blue light may include the organic electroluminescence device 1 of the foregoing embodiment as the organic electroluminescence device 21B. For example, each of the pixels 21 that emit red light as well as each of the pixels 21 that emit green light may include, as the organic electroluminescence device 21B, the organic electroluminescence device 1 of the foregoing embodiment that includes the organic light-emitting layer 113 instead of the organic light-emitting layer 13. Further, for example, each of the pixels 21 that emit red light as well as each of the pixels 21 that emit green light may include, as the organic electroluminescence device 21B, the organic electroluminescence device 1 of the foregoing embodiment that includes the organic light-emitting layer 113 instead of the organic light-emitting layer 13 and the hole transport layer 112 instead of the hole transport layer 112.

The pixel circuit 21A may control light emission and light extinction of the organic electroluminescence device 21B. The pixel circuit 21A may serve to hold a voltage that is written into each of the pixels 21 through write scanning described later. The pixel circuit 21A may include, for example, a drive transistor Tr1, a write transistor Tr2, and a holding capacitor Cs.

The write transistor Tr2 may control application of the signal voltage Vsig corresponding to the image signal Din, to a gate of the drive transistor Tr1. More specifically, the write transistor Tr2 may sample a voltage of the signal line DTL and write the sampled voltage into the gate of the drive transistor Tr1. The drive transistor Tr1 may be coupled in series to the organic electroluminescence device 21B. The drive transistor Tr1 may drive the organic electroluminescence device 21B. The drive transistor Tr1 may control a current that flows through the organic electroluminescence device 21B on the basis of the magnitude of the voltage sampled by the write transistor Tr2. The holding capacitor Cs may hold a predetermined voltage between the gate and a source of the drive transistor Tr1. The holding capacitor Cs may serve to allow a gate-source voltage Vgs of the drive transistor Tr1 to be constant during a predetermined period. It is to be noted that the pixel circuit 21A either may have a circuit configuration that includes components such as various capacitors and various transistors in addition to the above-described 2Tr1C circuit configuration, or may have a circuit configuration different from the above-described 2Tr1C circuit configuration.

The signal lines DTL may be each coupled to an output end of the horizontal selector 41 described later, and also coupled to one of a source and a drain of the write transistor Tr2. The scanning lines WSL may be each coupled to an output end of the write scanner 42 described later, and also coupled to a gate of the write transistor Tr2. The power supply lines DSL may be each coupled to an output end of a power supply circuit 33, and also coupled to one of the source and a drain of the drive transistor Tr1.

The gate of the write transistor Tr2 may be coupled to corresponding one of the scanning lines WSL. One of the source and the drain of the write transistor Tr2 may be coupled to corresponding one of the signal lines DTL. A terminal of the source and the drain of the write transistor Tr2, which is not coupled to any of the signal lines DTL, may be coupled to the gate of the drive transistor Tr1. One of the source and the drain of the drive transistor Tr1 may be coupled to corresponding one of the power supply lines DSL. A terminal of the source and the drain of the drive transistor Tr1, which is not coupled to any of the power supply lines DSL, may be coupled to the anode 11 of the organic electroluminescence device 21B. One end of the holding capacitor Cs may be coupled to the gate of the drive transistor Tr1. The other end of the holding capacitor Cs may be coupled to a terminal, on organic electroluminescence device 21B side, of the source and the drain of the drive transistor Tr1.

(Driver 40)

The driver 40 may include the horizontal selector 41 and the write scanner 42, for example. The horizontal selector 41 may apply to each of the signal lines DTL the analog signal voltage Vsig inputted from the controller 30, in response to (in synchronization with) reception of a control signal, for example. The write scanner 42 may scan the plurality of pixels 21 on a predetermined-unit basis.

(Controller 30)

Description is next given of the controller 30. The controller 30 may perform predetermined correction on the digital image signal Din inputted from the outside, thereby generating the signal voltage Vsig on the basis of an image signal obtained through the predetermined correction, for example. The controller 30 may output the generated signal voltage Vsig to the horizontal selector 41, for example. The controller 30 may output a control signal to each of the circuits inside the driver 40 in response to (in synchronization with) the synchronization signal Tin inputted from the outside, for example.

[Effects]

In the present embodiment, one or more of the plurality of organic electroluminescence devices 21B included in the display panel 20 are configured by the organic electroluminescence device 1 of the foregoing embodiment. Consequently, it becomes possible to achieve the organic electroluminescence unit 2 having high light emission efficiency.

3. Application Examples

Application Example 1

Description is given below of an application example of the organic electroluminescence unit 2 described in the foregoing second embodiment. The organic electroluminescence unit 2 is applicable to display units of electronic apparatuses in any fields that display, as an image or a picture, an image signal inputted from the outside or an image signal generated inside, such as televisions, digital cameras, notebook personal computers, sheet-like personal computers, portable terminal devices such as mobile phones, and video cameras.

FIG. 8 is a perspective view of an appearance of an electronic apparatus 3 according to the present application example. The electronic apparatus 3 may be, for example, a sheet-like personal computer provided with a display surface 320 on a main surface of a casing 310. The electronic apparatus 3 may be provided with the organic electroluminescence unit 2 on the display surface 320 of the electronic apparatus 3. The organic electroluminescence unit 2 may be disposed to allow the display panel 20 to face outward. In the present application example, the organic electroluminescence unit 2 may be provided on the display surface 320, thus making it possible to achieve the electronic apparatus 3 having high light emission efficiency.

Application Example 2

Description is given below of an application example of the organic electroluminescence device 1 described in the foregoing first embodiment. The organic electroluminescence device 1 is applicable to light sources for illumination apparatuses in any fields, such as illumination apparatuses for table lighting or floor lighting, and illumination apparatuses for room lighting.

FIG. 9 illustrates an appearance of an illumination apparatus for room lighting to which the organic electroluminescence device 1 is applicable. The illumination apparatus may include, for example, an illuminating section 410 including one or a plurality of organic electroluminescence devices 1. Appropriate numbers of the illuminating sections 410 may be provided at appropriate intervals on a ceiling 420 of a building. It is to be noted that application of the illuminating section 410 is not only limited to the ceiling 420; the illuminating section 410 may also be installed on any place such as a wall 430 and an unillustrated floor depending on use application.

In these illumination apparatuses, illumination is performed using light supplied from the organic electroluminescence device 1. Thus, it becomes possible to achieve the illumination apparatus having high light emission efficiency.

Although the disclosure has been described hereinabove by way of example with reference to the embodiments and the application examples, the disclosure is not limited thereto but may be modified in a wide variety of ways. It is to be noted that the effects described hereinabove are mere examples. The effects according to an embodiment of the disclosure are not limited to those described hereinabove. The disclosure may further include other effects in addition to the effects described hereinabove.

Moreover, the disclosure may also have the following configurations.

(1) An organic electroluminescence device including, in order:
a first electrode;
a hole transport layer configured by a coated film;
an organic light-emitting layer configured by a coated film;
an electron transport layer; and
a second electrode,
in which the organic light-emitting layer has a light emission region provided in the organic light-emitting layer on side of the electron transport layer.

(2) The organic electroluminescence device according to (1), in which the light emission region is positioned in a vicinity of an interface of the organic light-emitting layer, the interface being provided on side of the electron transport layer.

(3) The organic electroluminescence device according to (1) or (2), in which the hole transport layer includes an insolubilized hole transport layer.

(4) The organic electroluminescence device according to (3), in which the electron transport layer has an energy gap that is larger than an energy gap of the organic light-emitting layer.

(5) The organic electroluminescence device according to (4), in which the electron transport layer includes a deposited film.

(6) The organic electroluminescence device according to (5), in which the organic light-emitting layer includes, as an organic light-emitting material, a host material and a dopant material.

(7) The organic electroluminescence device according to any one of (1) to (6), in which the organic light-emitting layer has hole mobility that is larger than electron mobility.

(8) The organic electroluminescence device according to any one of (1) to (7), in which the organic light-emitting layer has a hole current that is larger than an electron current of the organic light-emitting layer.

(9) The organic electroluminescence device according to (8), in which a position of the light emission region provided in the organic light-emitting layer comes closer to the electron transport layer, as a quotient of the hole current divided by the electron current becomes larger.

(10) The organic electroluminescence device according to any one of (1) to (9), in which the organic light-emitting layer is made of an organic light-emitting material that has a molecular orientation degree specified by a parameter S', the parameter S' satisfying the following inequality:

$0.66 < S' < 0.75$, provided that $S' = \{(2 \times ko)/(ke + 2ko)\}$ where ko denotes an extinction coefficient in a film-plane direction of the organic light-emitting layer, and ke denotes an extinction coefficient in a film-thickness direction of the organic light-emitting layer.

(11) The organic electroluminescence device according to (10), in which a position of the light emission region provided in the organic light-emitting layer comes closer to the electron transport layer, as the parameter S' comes closer to 0.66.

(12) An organic electroluminescence unit provided with a plurality of organic electroluminescence devices, one or more of the plurality of organic electroluminescence devices including, in order:
a first electrode;
a hole transport layer configured by a coated film;
an organic light-emitting layer configured by a coated film;
an electron transport layer; and
a second electrode,
in which the organic light-emitting layer has a light emission region provided in the organic light-emitting layer on side of the electron transport layer.

(13) An electronic apparatus provided with an organic electroluminescence unit, the organic electroluminescence unit having a plurality of organic electroluminescence devices, one or more of the plurality of organic electroluminescence devices including, in order:
a first electrode;
a hole transport layer configured by a coated film;
an organic light-emitting layer configured by a coated film;
an electron transport layer; and
a second electrode,
in which the organic light-emitting layer has a light emission region provided in the organic light-emitting layer on side of the electron transport layer.

According to the organic electroluminescence device, the organic electroluminescence unit, and the electronic apparatus of the respective embodiments of the disclosure, the organic light-emitting layer has a light emission region provided in the organic light-emitting layer on electron transport layer side, thus making it possible to enhance the device performance of the organic electroluminescence device. It is to be noted that the foregoing technical contents are mere examples of the disclosure. The effects according to an embodiment of the disclosure are not limited to those described hereinabove. The disclosure may have effects different from those described hereinabove, or may further include other effects in addition to those described hereinabove.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. An organic electroluminescence device comprising, in order:
a first electrode;
a hole transport layer, that is a coated film, which is formed by coating and drying a solution containing, as a solute, a hole transporting material having an insoluble group, the hole transport layer being insoluble to an organic solvent or water;
a single organic light-emitting layer that is another coated film;
an electron transport layer; and
a second electrode, wherein
the organic light-emitting layer has a light emission region and a non-emission region,
the light emission region and the non-emission region each include a host material and a dopant material, and
greater than 50% of the light emission region is in a half of the organic light-emitting layer that is closer to the electron transport layer than to the hole transport layer.

2. The organic electroluminescence device according to claim 1, wherein the electron transport layer has an energy gap that is larger than an energy gap of the organic light-emitting layer.

3. The organic electroluminescence device according to claim 2, wherein the electron transport layer is a deposited film.

4. The organic electroluminescence device according to claim 1, wherein the organic light-emitting layer has hole mobility that is larger than electron mobility.

5. The organic electroluminescence device according to claim 1, wherein the organic light-emitting layer has a hole current that is larger than an electron current of the organic light-emitting layer.

6. The organic electroluminescence device according to claim 5, wherein a position of the light emission region becomes closer to an interface of the organic light-emitting layer and the electron transport layer as a quotient of the hole current divided by the electron current becomes larger.

7. The organic electroluminescence device according to claim 1, wherein the organic light-emitting layer is made of an organic light-emitting material that has a molecular orientation degree specified by a parameter S', the parameter S' satisfying the following inequality:

$0.66 < S' < 0.75$, provided that $S' = \{(2 \times ko)/(ke + 2ko)\}$ where ko denotes an extinction coefficient in a film-plane direction of the organic light-emitting layer, and ke denotes an extinction coefficient in a film-thickness direction of the organic light-emitting layer.

8. The organic electroluminescence device according to claim 7, wherein a position of the light emission region becomes closer to an interlace of the organic light-emitting layer and the electron transport layer as the parameter S' comes closer to 0.66.

9. An electronic apparatus provided with an organic electroluminescence unit, the organic electroluminescence unit having a plurality of organic electroluminescence devices, one or more of the plurality of organic electroluminescence devices comprising, in order:
a first electrode;
a hole transport layer, that is a coated film, which is formed by coating and drying a solution containing, as a solute, a hole transporting material having an insoluble group, the hole transport layer being insoluble to an organic solvent or water;
a single organic light-emitting layer that is another coated film;
an electron transport layer; and
a second electrode, wherein
the organic light-emitting layer has a light emission region and a non-emission region,
the light emission region and the non-emission region each include a host material and a dopant material, and
greater than 50% of the light emission region is in a half of the organic light-emitting layer that is closer to the electron transport layer than to the hole transport layer.

10. The organic electroluminescence device according to claim 1, wherein the hole transport layer has an energy gap that is substantially the same as an energy gap of the organic light-emitting layer.

11. The organic electroluminescence device according to claim 1, wherein the insoluble group is selected from a group consisting of a cross-linking group and a thermal dissociation soluble group.

12. The electronic apparatus according to claim 9, wherein the hole transport layer has an energy gap that is substantially the same as an energy gap of the organic light-emitting layer.

13. The electronic apparatus according to claim 9, wherein the insoluble group is selected from a group consisting of a cross-linking group and a thermal dissociation soluble group.

14. The organic electroluminescence device according to claim 1, wherein at least 90% of the light emission region is in the half of the organic light-emitting layer that is closer to the electron transport layer than to the hole transport layer.

15. An organic electroluminescence device comprising, in order:
a first electrode:
a hole transport layer, that is a coated film, which is formed by coating and drying a solution containing, as a solute, a hole transporting material having an insoluble group, the hole transport layer being insoluble to an organic solvent or water;
a single organic light-emitting layer that is another coated film;
an electron transport layer; and
a second electrode, wherein
the organic light-emitting layer has a light emission region and a non-emission region,
the light emission region and the non-emission region each include a host material and a dopant material,
the organic light-emitting layer includes a first region extending from a middle of the organic light emitting layer to the electron transport layer, and a second region extending from the middle of the organic light-emitting layer to the hole transport layer, and
greater than 50% of the light emission region is in the first region.

16. The organic electroluminescence device according to claim 15, wherein the light emission region extends from the first region to at least a part of the second region.

17. The organic electroluminescence device according to claim 1, wherein the light emission region is smaller than an entirety of the organic light-emitting layer.

* * * * *